(12) United States Patent
Yano et al.

(10) Patent No.: US 7,965,791 B2
(45) Date of Patent: *Jun. 21, 2011

(54) TRANSMITTING APPARATUS WITH BIT ARRANGEMENT METHOD

(75) Inventors: Tetsuya Yano, Yokosuka (JP); Kazuhisa Obuchi, Yokohama (JP); Shunji Miyazaki, Yokosuka (JP)

(73) Assignee: Fujitsu Limited, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/836,860

(22) Filed: Jul. 15, 2010

(65) Prior Publication Data

US 2010/0278282 A1    Nov. 4, 2010

Related U.S. Application Data

(63) Continuation of application No. 10/899,068, filed on Jul. 27, 2004.

(30) Foreign Application Priority Data

Feb. 12, 2004    (JP) .................. 2004-035768

(51) Int. Cl.
*H04L 27/36* (2006.01)

(52) U.S. Cl. ........ 375/298; 375/264; 375/261; 370/208; 370/335; 370/474

(58) Field of Classification Search .................. 375/264, 375/298, 261; 370/208, 335, 474

See application file for complete search history.

(56) References Cited

U.S. PATENT DOCUMENTS

| | | | |
|---|---|---|---|
| 5,970,098 A | 10/1999 | Herzberg | |
| 6,598,202 B1 | 7/2003 | Kim et al. | |
| 7,272,191 B2 * | 9/2007 | Taffin et al. | 375/261 |
| 7,324,472 B2 | 1/2008 | Dottling et al. | |
| 2002/0163975 A1 | 11/2002 | Uesugi et al. | |
| 2002/0199147 A1 * | 12/2002 | Kim et al. | 714/748 |
| 2003/0031233 A1 | 2/2003 | Kim et al. | |

(Continued)

FOREIGN PATENT DOCUMENTS

FR    2800947    5/2001

(Continued)

OTHER PUBLICATIONS

Stephane LeGOff, Alain Glavieux, Claude Berrou; "Turbo-Codes and Hight Spectral Efficiency Modulation"; dated 1994, pp. 645-649.

(Continued)

*Primary Examiner* — Dac V Ha
*Assistant Examiner* — Rahel Guarino
(74) *Attorney, Agent, or Firm* — Myers Wolin, LLC.

(57) ABSTRACT

A method of transmitting data including controlling generation of bit sequences to adjust an occupation rate occupied with predetermined bits included in a first data block, which is obtained by encoding first data, to be closer to an occupation rate occupied with predetermined bits included in a second data block, which is obtained by encoding second data. With regard to first bit positions of the predetermined bits, the first bit positions being distinguished from second bit positions based on an error tolerance resulting from a correspondence to a signal point on a phase plane. Wherein a sum of a number of the predetermined bits included in the first data block and the predetermined bits included in the second data block is less than a total number of the first bit positions. Also including performing multi-level modulation for transmission based on the generated bit sequences.

10 Claims, 11 Drawing Sheets

U.S. PATENT DOCUMENTS

| | | | |
|---|---|---|---|
| 2003/0081576 | A1 | 5/2003 | Kim et al. |
| 2004/0001555 | A1 | 1/2004 | Taffin et al. |
| 2005/0076284 | A1 | 4/2005 | Dottling et al. |
| 2005/0102600 | A1 | 5/2005 | Anandakumar |

FOREIGN PATENT DOCUMENTS

| | | |
|---|---|---|
| JP | 2002-171298 | 6/2002 |
| JP | 2003-023373 | 1/2003 |
| WO | WO 03/034640 | 4/2003 |
| WO | WO 03/039055 | 5/2003 |

OTHER PUBLICATIONS

ETSI TS 125 212 V3.1.1; Jan. 2000; Universal Mobile Telecommunications System (UMTS); Multiplexing and Channel Coding (FDD); XP-002161524. dated Jan. 2000.

TSG-RAN WG1 #23; Jan. 8-11, 2002; Text Proposal for SMP (Symbol Mapping Based on Bit Priority) 6 pages; dated Jan. 8-11, 2002.

TSG-RAN Working Group 1 #24; Feb. 18-22, 2002; an Optimisation of the Bit Distribution Function for HSDPA; XP-002227068; dated Feb. 18-22, 2002; pp. 1-3.

TSG-RAN WG1 #21 meeting; Aug. 27-31, 2001; Consideration of SMP (Symbol Mapping Based on Priority); XP-002227070; 5-pages; dated Aug. 27-31, 2001.

ETSI TS 125 213 V6.0.0; Dec. 2003; Universal Mobile Telecommunications System (UMTS), Spearding and Modulation (FDD); dated Dec. 2003.

European Search Report with Written Opinion for corresponding European Application No. 04256381.7-2415, dated Aug. 3, 2007.

Japanese Patent Office Notice of Rejection for corresponding Japanese Application No. 2004-035768, with English Translation attached; Issued Jun. 30, 2009.

United States Patent & Trademark Office "Non-Final Office Action" issued for corresponding U.S. Appl. No. 12/948,341, mailed Feb. 18, 2011.

European Patent Office, "Extended European Search Report" issued for corresponding European Patent Application 10184417.3, mailed Feb. 2, 2011.

European Patent Office "correspondence" issued for corresponding European Patent Application No. 04 256 381.7, dated Jan. 26, 2011.

Extended European Search Report with written opinion, issued by the European Patent Office for corresponding European Patent Application No. 10184618.6, mailed Mar. 8, 2011.

Extended European Search Report with written opinion, issued by the European Patent Office for corresponding European Patent Application No. 10184588.1 mailed Mar. 8, 2011.

United States Patent Office "Non-Final Office Action" for corresponding U.S. Appl. No. 13/032,255, dated Apr. 1, 2011.

United States Patent Office "Non-Final Office Action" for corresponding U.S. Appl. No. 13/033,715, dated Mar. 31, 2011.

* cited by examiner

TRANSMITTING APPARATUS WITH BIT ARRANGEMENT METHOD

CROSS-REFERENCE TO RELATED APPLICATIONS

This present application is a continuation of U.S. application Ser. No. 10/899,068, filed Jul. 27, 2004, now pending, which claims the benefit of Japanese Patent Application No. 2004-35768 filed on Feb. 12, 2004, the contents of each are herein wholly incorporated by reference.

FIELD OF THE INVENTION

The present invention relates to a transmitting apparatus that generates bit sequences so as to tend to equalize error tolerance among blocks of data that are transmitted.

DESCRIPTION OF THE RELATED ART

Standardization is now under development for the W-CDMA system which is a system of the 3rd generation mobile communication systems of the 3rd generation Partnership Project (3GPP). As a theme of the standardization, the High Speed Downlink Packet Access (HSDPA), which can provide a maximum transmission rate of about 14 Mbps in the downlink, is specified. The HSDPA employs an adaptive coding modulation scheme and is characterized, for example, in that the QPSK modulation scheme and the 16 QAM scheme are adaptively switched in accordance with the radio transmission environment between the base stations and mobile stations. Moreover, the HSDPA also employs the Hybrid Automatic Repeat request (H-ARQ) scheme in which if an error is detected in the data transmitted from a base station, re-transmission is executed responding to a request from a mobile station.

The main radio channels used for the HSDPA include the High Speed-Shared Control Channel (HS-SCCH), the High Speed-Physical Downlink Shared Channel (HS-PDSCH), and the High Speed-Dedicated Physical Control Channel (HS-DPCCH).

The HS-SCCH and HS-PDSCH are both shared channels for a downlink (namely, in the direction from the base station to the mobile station), while HS-SCCH is the control channel for transmitting various parameters in regard to the data transmitted by the HS-PDSCH. Among the parameters, information such as the modulation type, which indicates the modulation scheme used for transmission of the data with HS-PDSCH, and the number of assignments (number of codes) of the spread code, may be listed.

Meanwhile, the HS-DPCCH is an dedicated control channel for the uplink (namely, in the direction from the mobile station to the base station) and is used when the mobile station transmits the ACK and NACK signals to the base station in accordance with acknowledgment and no-acknowledgement of reception of data received via the HS-PDSCH.

Moreover, the HS-DPCCH is also used for transmitting the result of the measurement of the reception quality (for example, the signal to interference ratio (SIR)) to the base station as the Channel Quality Indicator (CQI). The base station judges quality of radio environment of the downlink based on the received CQI. When the environment is not good, a modulation scheme which is capable of transmitting the data at a higher transmission rate is selected. When the environment is good, a modulation scheme which is capable of transmitting the data at a lower transmission rate is selected (namely, adaptive modulation is executed).

Channel Format

Next, a channel format in the HSDPA will be described.

FIG. 1 is a diagram illustrating a channel format in the HSDPA. Since W-CDMA employs the code division multiplexing system, each channel is separated with the spreading codes.

First, the channels not described above will be described briefly.

Common Pilot Channel (CPICH) and Primary Common Control Physical Channel (P-CCPCH) are respectively common channels for the downlink.

The CPICH is used for estimation of channel condition and cell search in the mobile station and as the timing reference for the other physical channel for downlink in the same cell. In other words, this CPICH is the channel for transmitting the pilot signal. The P-CCPCH is the channel for transmitting the broadcast information to the mobile stations.

Next, timing relationship of channels will be described with reference to FIG. 1.

As illustrated in the figure, each channel forms one frame (10 ms) with 15 slots. As described previously, since the CPICH is used as the reference of the other channel, the top of frames the P-CCPCH and HS-SCCH are matched with the top of frame of the CPICH. Here, the top of frame of the HS-PDSCH is delayed by two slots from the HS-SCCH or the like in order to execute the demodulation of the HS-PDSCH with the demodulation method corresponding to the received modulation type after the mobile station has received the modulation type information via the HS-SCCH. Moreover, the HS-SCCH and HS-PDSCH form one sub-frame with three slots.

The HS-DPCCH is used as the uplink channel, although not synchronized with the CPICH, on the basis of the timing generated by the mobile station.

The channel format of the HSDPA has been described above briefly. Next, the process up to transmission of the transmission data via the HS-PDSCH will then be described with reference to the block diagram.

Structure of Base Station

FIG. 2 illustrates a structure of a base station supporting the HSDPA.

In FIG. 2, the reference numeral 1 designates a CRC attachment unit; 2, a code block segmentation unit; 3, a channel coding unit; 4, a bit separating unit; 5, a rate matching unit; 6, a bit collecting unit; and 7, a modulation unit.

Next, operations of each unit will be described.

The transmission data transmitted via the HS-PDSCH (data stored in one sub-frame of the HS-PDSCH in FIG. 1) is first subjected to the CRC arithmetic process in the CRC attachment unit. Accordingly, the result of the arithmetic operations is attached to the last portion of the transmission data. The transmission data to which the result of CRC arithmetic operation is attached is then input to the code block segmentation unit 2 and is then segmented into a plurality of blocks. This segmentation is executed to shorten the unit data length for the error correcting coding, considering the load of decoding process on the receiving side. When the length of data has exceeded the predetermined length, the data is equally segmented into a plurality of blocks. An integer 2 or larger is selected as the number of segmentations and, as an example, the processes when the number of segmentations is 2 will be described here.

The segmented transmission data are respectively processed as the object data of individual error correcting coding processes in the channel coding unit 3. Namely, the error correcting coding process is executed respectively to the segmented first block and second block. As an example of the channel coding, turbo coding is considered.

Here, the turbo coding system will be described briefly. In the turbo coding system, when the object data of the coding is defined as U, the data U itself, the data U' obtained by the convolutional coding of the data U and the data U" obtained by executing the interleaving on the data U and then executing the convolutional coding on the interleaved data are outputted. Here, U is called the systematic bits and are the data used in both element decoders for the turbo decoding. This data U can be understood as the data having higher importance because of higher application frequency. On the other hand, U' and U" are called the redundant bits and are used only one of two element decoders. These data can be understood as having a degree of importance which is lower than the data U because of lower application frequency.

Namely, it can be said that the systematic bits have a degree of importance which is higher than that of the redundant bits and a correct decoding result can be obtained with the turbo decoder if the systematic bits are received more correctly.

The systematic bits and redundant bits generated as described above are inputted as the serial data to the bit separating unit 4. The bit separating unit 4 separates the input serial data into the data U. U' and U" of three systems and then outputs these data as parallel data.

The rate matching unit 5 executes the puncturing process for deleting the bits and also executes the repetition process by repeating the bits with the predetermined algorithm in order to store the data into a sub-frame formed of three slots of the HS-PDSCH.

The bits having completed the bit adaptation process to the sub-frame in the rate matching unit 5 are then input in parallel to the bit collecting unit 6.

The bit collecting unit 6 generates and outputs, on the basis of the input data, bit sequences of 4 bits indicating each signal point, for example, of the 16 QAM modulation.

The modulating unit 7 outputs the signal modulated by the 16 QAM modulating method in the amplitude and phase corresponding to the signal point indicated by the input bit sequence and then sends the signal to the antenna (not illustrated) after conversion into a radio frequency signal through frequency conversion.

Arrangement Method

Here, the processes in the bit collecting unit will be described in further detail.

FIG. 3 illustrates the arrangement method in the bit collecting unit 6.

The bits including the systematic bits, redundant bits or the like output through the rate matching process are required to correspond to the bit sequences indicating the signal points in the 16 QAM modulation. Therefore, these data must be arranged in the units of 4 bits.

The systematic bits and redundant bits are segmented, by the code block segmentation unit, into two groups, the first block, and the second block. However, since these bits are stored in the same sub-frame, the bits are coupled again into one aggregation and processed as one data block in the bit collecting unit 6.

In FIG. 3, the bit sequences as a whole indicated as Nr(4)× N$_c$(10) corresponds to the coupled systematic bits and redundant bits. The regions indicated as S1, S2, S3 and P2–1 of the first column are bit sequences corresponding to one signal point for the 16 QAM modulation. According to FIG. 3, since 10 bit sequences are provided, a 10 bit sequence expresses 10 signal points because 1 bit sequence expresses 1 signal point.

Next, a bit alignment procedure will be described.

First, in the code block segmentation unit 2, the total number of systematic bits N$_{sys}$ of each block of two segmented blocks (the sum of the number of the first systematic bits and the number of the second systematic bits after the rate matching process) is obtained.

Next, a quotient A and a remainder B are obtained by dividing N$_{sys}$ with the total number of columns N$_c$ (total number of bits 40÷number of bit sequences 4=10).

The number of rows, which is equal to the quotient A obtained, are defined sequentially from the top as the regions for systematic bits. Moreover, the regions in the left side of the rows of the regions occupied by the systematic bits are sequentially defined, as many as the same number as the remainder B, as the regions for systematic bits.

According to this definition, the regions indicated in FIG. 3 with the oblique lines are defined as the regions for systematic bits. The remaining regions are defined as the regions for redundant (parity) bits.

Next, the systematic bits of the first block are sequentially assigned to the region defined for the systematic bits toward the bottom in the column direction from the first line, first column. When the systematic bits region of the first column are filled, the systematic bits of the second column are filled in the same manner.

Meanwhile, the redundant bits are sequentially assigned from the first column to the region for the redundant bits illustrated in FIG. 3. In particular, the redundant bits corresponding to U' are defined as the first redundant bits, while the redundant bits corresponding to U" are defined as the second redundant bits, the first bit of the second redundant bits of the first block is assigned to the first column of the redundant bits region, the first bit of the first redundant bits of the first block is assigned to the second column of the redundant bits region, and the second bit of the second redundant bits of the first block is assigned to the third column. As described above, the redundant bits regions are assigned by alternately assigning the second redundant bits and first redundant bits. In FIG. 3, the arrow marks indicate the arrangement sequence and PM-N indicates that N-th bit of the M-th redundant bits must be arranged.

The bit columns, namely bit sequences, arranged as described above, indicate the signal points on the phase plane illustrated in FIG. 4. For example, the bit column indicates the signal point A when (S1, S2, S3, P2–1)=(1, 0, 1, 1).

Such an arrangement method is disclosed, for example, in the following document:

3G TS 25. 213 (3rd Generation Partnership Project: Technical Specification on Group Radio Access Network; Spreading and modulation (FDD))

There are a number of problems to be found in the prior art described above.

Namely, when the mapping on the phase plane as described above is executed while multi-level modulation is introduced, the lower bits (S3, S6, S9, . . . , P2–7, P2–8, P2–1, P1–1, . . . , P1–7, P1–8) are in the trend, against the upper bits (S1, S4, S7, . . . , S21, S23, S2, S5, S8, . . . , S22, S24) of each aligned bit column, to easily generate an error during determination of the signal point on the receiving side due to variation of phase and amplitude in the radio transmission. However, as illustrated in FIG. 3, when the segmented first block is compared with the second block, the four systematic bits of the first block are arranged in the lower bits, while none of the systematic bits of the second block are assigned to the lower bits.

As described previously, the systematic bits can be understood as the important pieces of information. According to the arrangement method described above, however, tolerance to phase and amplitude variations during radio transmission is different among the blocks due to the arrangement of the systematic bits.

Moreover, when the number of systematic bits is rather small, when the segmented first block is compared with the second block as illustrated in FIG. 8, the redundant bits of the first block are not assigned to the upper bits. However, the four redundant bits of the second block are assigned to the upper bits. According to the arrangement method also as described above, tolerance to phase and amplitude variations during radio transmission is different among the blocks due to the arrangement of redundant bits.

Accordingly, there arise problems in that a difference in tolerance is generated among the blocks resulting from arrangement of signal points even when the same kind of bits are used in the blocks in any case of systematic bits and redundant bits, and moreover reception quality itself is also different in accordance with the block used, creating a difference in quality among the blocks.

An object of the present invention is to provide equalization of tolerance to an error among the blocks.

Moreover, there exists the problem that when an error correction process in the turbo coding process is to be executed, a block having higher tolerance has a margin of error correction that handles the occurrence of further error, but a block having lower tolerance likely falls into the situation in which an error is generated that exceeds the error correction capability, and therefore such a condition is not effective.

Another object of the present invention is to enhance the efficiency of error correction by equalizing the tolerance to error in the blocks when an error correction process, such as turbo coding, is to be executed.

Moreover, another object of the present invention is to reduce the case of transmitting unnecessary signals, by increasing likelihood of simultaneous generation of error in both blocks and that of no generation of error in either block. Such as system may re-transmit the block not generating an error because the system that cannot identify the block generating an error among a plurality of blocks is employed.

In addition, it can also be considered as one of the objects of the present invention to provide the effect which can be attained from each structure of the preferred embodiments thereof described later and which cannot be obtained with the prior art.

SUMMARY OF THE INVENTION

The present invention uses a transmitting apparatus generating a plurality of bit sequences using the bits included in a first data block and a second data block, controlling a plurality of the bit sequences to correspond to each signal point on the phase plane, and transmitting the signals obtained by the multi-level modulations in accordance with each signal point, wherein the apparatus comprises a bit sequence generating unit for controlling the generation of bit sequences to make an occupation rate occupied with the predetermined bits included in the first data block closer to the occupation rate occupied with the predetermined bits included in the second data block in regard to the predetermined bit positions distinguished in accordance with a degree of likelihood of error within the respective bit sequences generated resulting from the correspondence.

The present invention moreover uses the transmitting apparatus described above, wherein the transmission apparatus transmits the signals within a same radio frame.

The present invention uses the transmitting apparatus described above, wherein the respective bit sequences are provided, resulting from the correspondence, with first bit positions and second bit positions in which an error is more easily generated than that in the first bit positions, and the predetermined bit positions are the first bit positions or the second bit positions.

The present invention uses the transmitting apparatus described above, wherein the first data block and the second data block respectively include systematic bits and redundant bits, both predetermined bits included in the first data block and the predetermined bits included in the second data block are systematic bits, and the bit sequence generating unit executes control to preferentially arrange the systematic bits to the first bit positions in accordance with the control.

The present invention uses the transmitting apparatus described above, wherein the multilevel modulation is 16 QAM modulation and the first bit positions are upper bits (1st bit and 2nd bit), while the second bit positions are lower bits (3rd bit and 4th bit).

The present invention uses the transmitting apparatus described above, wherein the first data block and the second data block respectively include systematic bits and redundant bits, and the predetermined bits included in the first data block and the predetermined bits included in the second data block are systematic bits or redundant bits.

The present invention uses the transmitting apparatus described above, wherein the first data block and the second data block include systematic bits and first redundant bits and second redundant bits obtained by turbo encoding and both the predetermined bits included in the first data block and the predetermined bits included in the second data block are systematic bits, or redundant bits, or first redundant bits, or second redundant bits.

The present invention uses a transmitting apparatus comprising a segmentation unit for segmenting data and an error detection code for said data into N blocks, an error correcting encoding unit for respectively executing the error correcting coding process on the N blocks, an arrangement means for arranging N blocks of systematic bits and redundant bits obtained after the error correcting coding process into a plurality of bit sequences, and a transmitting unit for transmitting the data after execution of amplitude phase modulation corresponding to each signal point on the phase plane indicated by each bit sequence arranged, wherein the arrangement means equalizes the number of systematic bits of N blocks to be arranged in the side where an error is more easily generated.

The present invention uses the transmitting apparatus described above, wherein the arrangement means almost sequentially arranges a plurality of said bit sequences up to that included in the N blocks from that included in the first block and executes said equalizing by distributing bit sequences which are admitted to arrange said systematic bits in the side where an error is more easily generated.

A bit arrangement method in a bit arrangement apparatus for generating L bit sequences by segmenting transmit data into two or more bit groups including a first bit group including X bits and a second bit group including Y bits and then arranging the bits of the first bit group and the bits of the second bit group into a first bit position and a second bit position wherein an error is more easily generated than the first bit position, wherein certain bits included in the first bit group and certain bits included in the second bit group are preferably arranged to the first bit position, moreover, when <N> is defined as the maximum integer equal to or less than N, the number of the certain bits included in the first bit group arranged at the second bit position is set smaller than X+Y−<(X+Y)÷L>×L and the number of the certain bits included in the second bit group arranged at the second bit position is set equal to 1 or larger, where $$(<(X+Y))\div L>+1)\times(X+Y-<(X+Y)\div L>\times L) \, X,$$

$$2-(X+Y-<(X+Y)\div L>\times L).$$

A radio base station corresponding to HSDPA, comprising a bit collection unit for generating a bit matrix of 4×$N_c$ for 16 QAM by re-arranging the data having completed the rate matching process, wherein the data includes at least a first data block and a second data block through segmentation at a code block segmentation unit, when $N_{sys}$ is defined as a total number of systematic bits of the first data block and the second data block included in the data, <N> is defined as the maximum integer equal to or less than N, and A and B are respectively defined as A=<$N_{sys}$÷$N_c$>, B=$N_{sys}$−A×$N_c$, the bit collection unit continuously arranges the systematic bits up to $N_c$-th column from the first column for the A-th row from the first row and also arranges non-continuously the B systematic bits up to the $N_c$-th column from the first column for the (A+1)-th row.

BRIEF DESCRIPTION OF THE DRAWINGS

The preferred embodiments of the present invention will be described with reference to the accompanying drawings.

DETAILED DESCRIPTION OF THE PREFERRED EMBODIMENTS

Description of the First Embodiment

Figure 5:
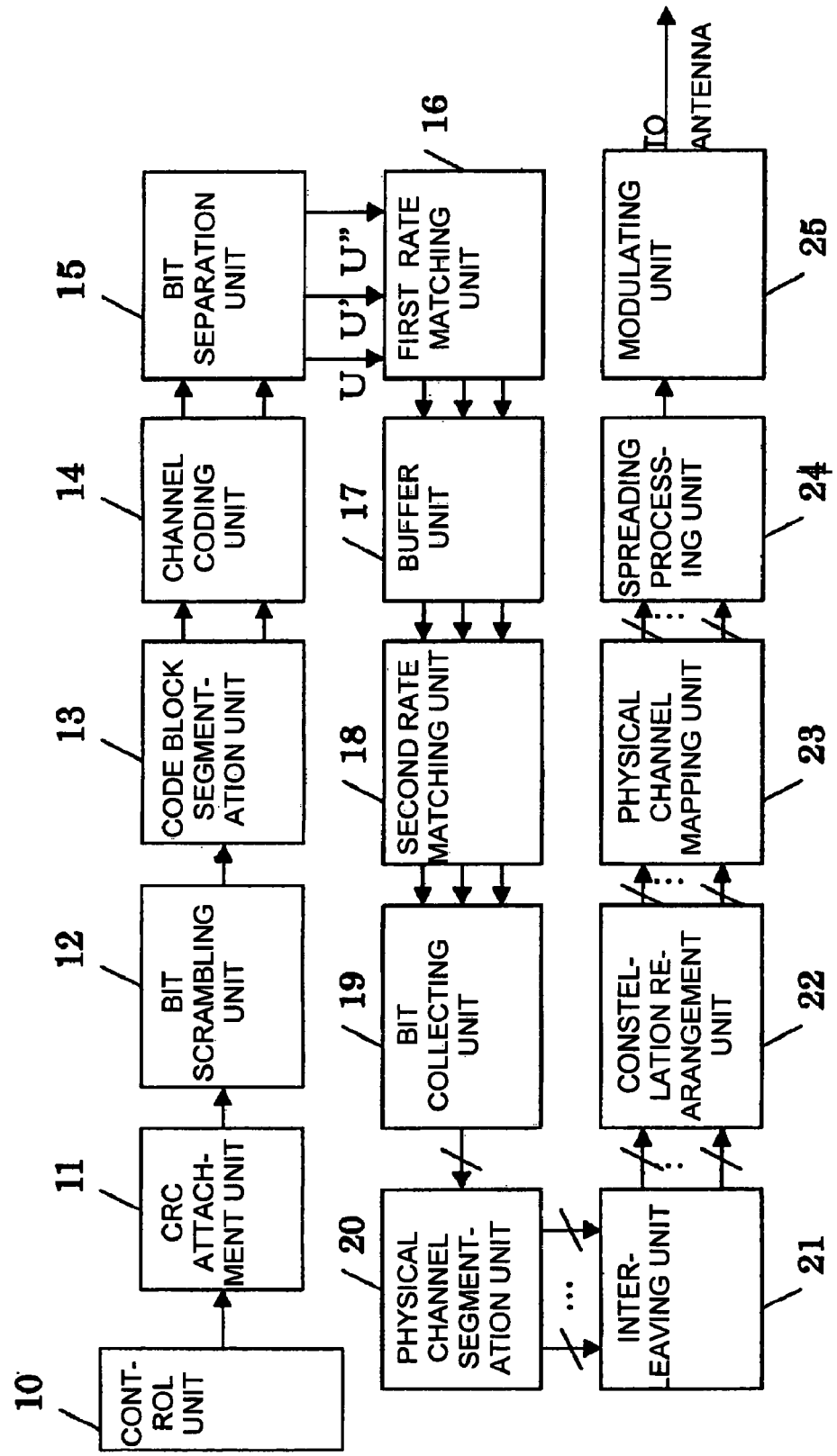
FIG. 5 is a diagram illustrating the transmitting apparatus of the present invention.

FIG. 5 illustrates an exemplary transmitting apparatus of the present invention.

As an example of the transmitting apparatus, the transmitting apparatus (radio base station) of the W-CDMA communication system corresponding to the HSDPA described previously will be described first. This transmitting apparatus can also be adapted to the transmitting apparatus used in the other communication system (for example UMTS).

In FIG. 5, reference numeral 10 designates a control unit for controlling each unit (11 to 25 or the like) by sequentially outputting the transmission data (each data to be transmitted within one sub-frame) to be transmitted through the HS-DSCH. The HS-DSCH is the shared channel and therefore the transmit data to be transmitted sequentially is respectively allowed to be destined to different mobile stations.

Numeral 11 designates a CRC attachment unit for adding a result of an arithmetic operation to the last part of the transmission data by executing the CRC arithmetic operation to the sequentially inputted transmission data (data to be transmitted within the same radio frame). Numeral 12 designates a bit scrambling unit for giving the randomized format to the transmission data by scrambling, in units of bits, the transmission data to which the result of the CRC arithmetic operation is attached.

Numeral 13 designates a code block segmentation unit for segmenting (for example, almost equally segmenting) the input transmit data after the bit scrambling if the data exceeds the predetermined data length in order to prevent, in the next channel coding, an increase in the amount of arithmetic operations of the decoder on the receiving side, which is caused when the length of the object data of coding becomes too long. In this figure, the input data length exceeds the predetermined data length and the output is illustrated when the transmitting data is segmented into two blocks (first data block and second data block). Of course, the data can also be segmented into more than two blocks and can also be segmented in different data lengths rather than equal lengths.

Numeral 14 designates a channel coding unit for individually executing the error correcting coding process on the segmented data. As the channel coding unit 14, a turbo encoder is preferably used and therefore the turbo encoder is used here as an example.

Therefore, the first output includes, in regard to the first block, as described previously, the important systematic bits (U) which is the same data as the coding object data, the first redundant bits (U') obtained by convolutional coding of the systematic bits (U) and the second redundant bits (U") obtained by convolutional coding of the systematic bits after the interleaving process. In the same manner, the second output includes, in regard to the second block, the systematic bits (U), first redundant bits (U') and the second redundant bits (U").

Numeral 15 designates a bit separation unit for separately outputting the systematic bits (U), first redundant bits (U') and second redundant bits (U") of the first block inputted in serial form from the channel coding unit 14 (turbo encoder). This process is also adapted to the second block and therefore only the output corresponding to the first block is illustrated.

Numeral 16 designates a first rate matching unit for executing the rate matching process such as the puncturing process to store the data within a predetermined region of a buffer unit 17 in the subsequent stage.

Numeral 17 designates a buffer unit for storing the data having completed the rate matching process in the first rate matching unit 16 into the preset region which has been set by the control unit 10 in accordance with the receiving capability of the mobile station as the data transmitting object. However the buffer can be omitted, such as with a virtual buffer.

Numeral 18 designates a second rate matching unit for adjusting the data length to that for storing within one sub-frame designated with the control unit 10. The length of the input data is adjusted to the designated length by executing the puncturing process or repetition process.

In the HS-PDSCH, since the parameters such as modulation method, spreading factor (SF), and number of codes (number of channels) are variable, the number of bits to be stored is not constant even in a sub-frame of the same time length. The control unit 10 indicates the number of bits corresponding to the parameters to the second rate matching unit 18 as the data length which may be stored within one sub-frame.

Numeral 19 designates a bit collection unit for arranging the data into a plurality of bit sequences from the second rate matching unit 19. Namely, a plurality of bit sequences are inputted in order to indicate the signal points on the phase plane by arranging the data of the first block and the data of the second block with the bit arrangement method which will be described later. In this embodiment, the bit sequence is formed of four bits because the 16 QAM modulation scheme is employed. It can naturally be considered to use other multi-level modulation systems (for example, 8 PSK method or the like).

Numeral 20 designates a physical channel segmentation unit for segmenting the bit sequences and then outputting groups of the bit sequences to the sequences of the same number as the number of spreading codes (number of codes) indicated by the control unit 10, namely for sequentially sharing and outputting, when the number of codes in the transmitting parameters is N, the input bit sequences to the sequences 1 to N.

Numeral 21 designates an interleaving unit for respectively executing the interleaving process on the bit sequences of the N sequences.

Numeral 22 designates a constellation re-arrangement unit for 16 QAM which can re-arrange the bits within each bit sequence for input bit sequences. For example, it is possible that the input bit sequence is output directly during the first transmission and bit re-arrangement can be executed at the time of re-transmission in the H-ARQ described above. The bit re-arrangement process, for example, replaces the upper bits and the lower bits. The bit re-arrangement process is preferably executed equally for a plurality of bit sequences. It is also possible during re-transmission that the input bit sequence is output directly without any bit re-arrangement process.

Numeral 23 designates a physical channel mapping unit for sharing the bit sequences of the N sequences in the subsequent stage into N spreading units included in the spreading processing unit 24.

Numeral 24 designates a spreading processing unit which is provided with a plurality of spreading portions for outputting the corresponding I, and Q voltage values on the basis of the bit sequences of the N sequences and then also outputting the data by executing the spreading process with different spreading codes.

The bit sequences of four bits are respectively converted to respective voltage values of the I and Q elements according to Table 1. However, the upper bits sequentially correspond to I1, Q1, I2, and Q2.

TABLE 1

| I1, I2 | I (after conversion) | Q1, Q2 | Q (after conversion) |
|---|---|---|---|
| 0, 0 | +1 | 0, 0 | +1 |
| 0, 1 | +3 | 0, 1 | +3 |
| 1, 0 | −1 | 1, 0 | −1 |
| 1, 1 | −3 | 1, 1 | −3 |

Table 1 will be described with reference to an example. When the bit sequence of four bits is expressed as (0100), I1 and I2 are 0, 0 and Q1, Q2=1, 0. Accordingly, this bit sequence is converted to the voltages of I=+1 and Q=−1.

Figure 6:
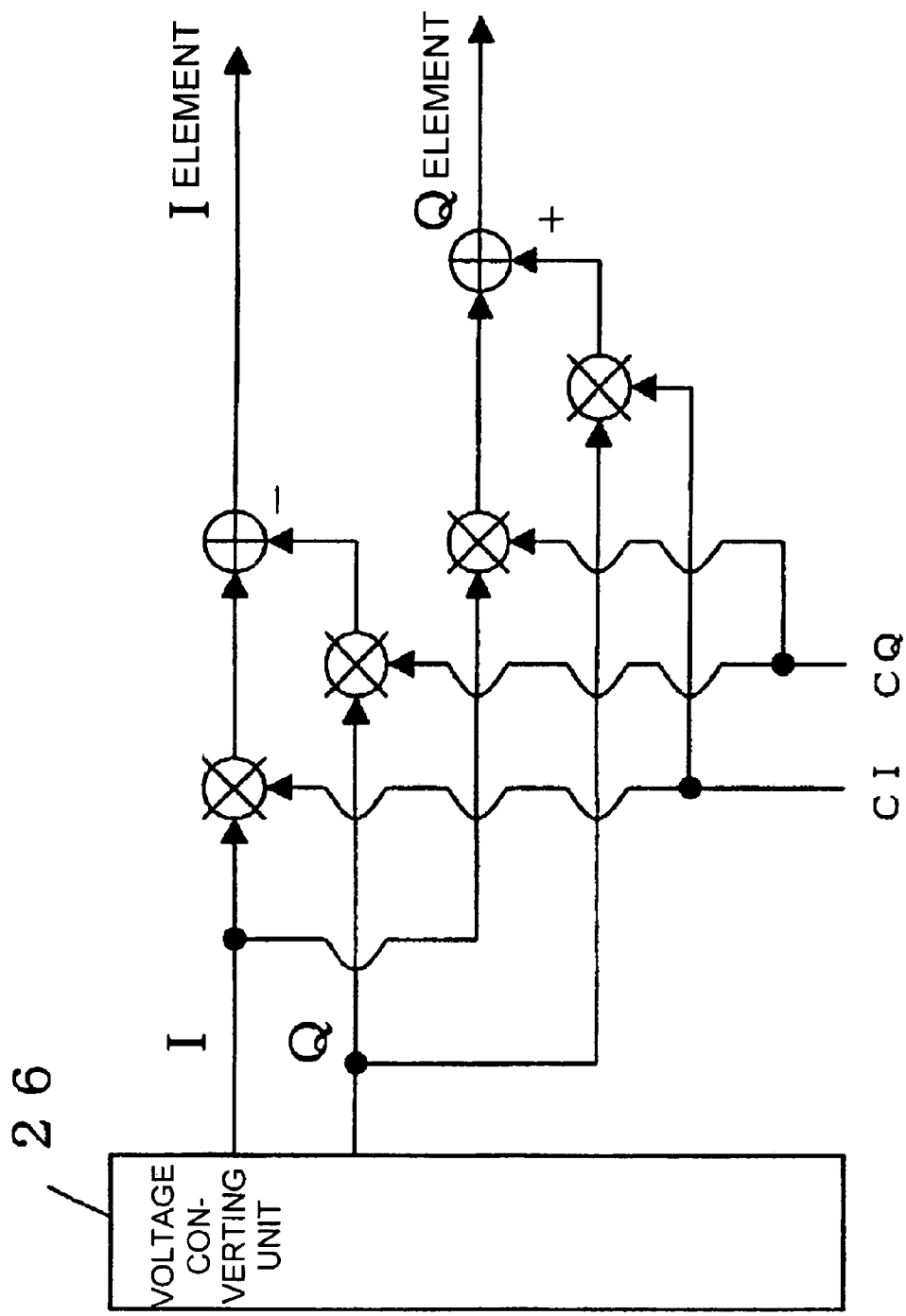
FIG. 6 is a diagram illustrating a structure of the spreading processing unit 24.

As the spreading method, for example, as illustrated in FIG. 6, after the conversion in table 1 with a voltage converting unit 26, arithmetic operations are executed with a multiplier, an adder and a subtracter on the basis of the I element CI and the Q element CQ of the spreading code in order to perform the spreading process.

Returning to FIG. 5, numeral 25 designates a modulating unit for adding (combining) each signal spread by the spreading processing unit 24, executing the amplitude/phase modulation, for example, of the 16 QAM modulation method on the basis of the added signal and transmitting the signal to an antenna as a radio signal through frequency conversion to a radio signal.

The names and operations of respective units have been described above and it can be understood that a plurality of bit sequences are generated using the bits included in the first data block and second data block, each bit sequence is controlled to correspond to each signal point on the phase plane, and phase/amplitude modulation is performed in accordance with each signal point.

Bit Arrangement Method

Next, the bit arrangement method in the bit collecting unit 19 will be described in more detail, as an example of the bit sequence generating means and arrangement method.

Figure 7:
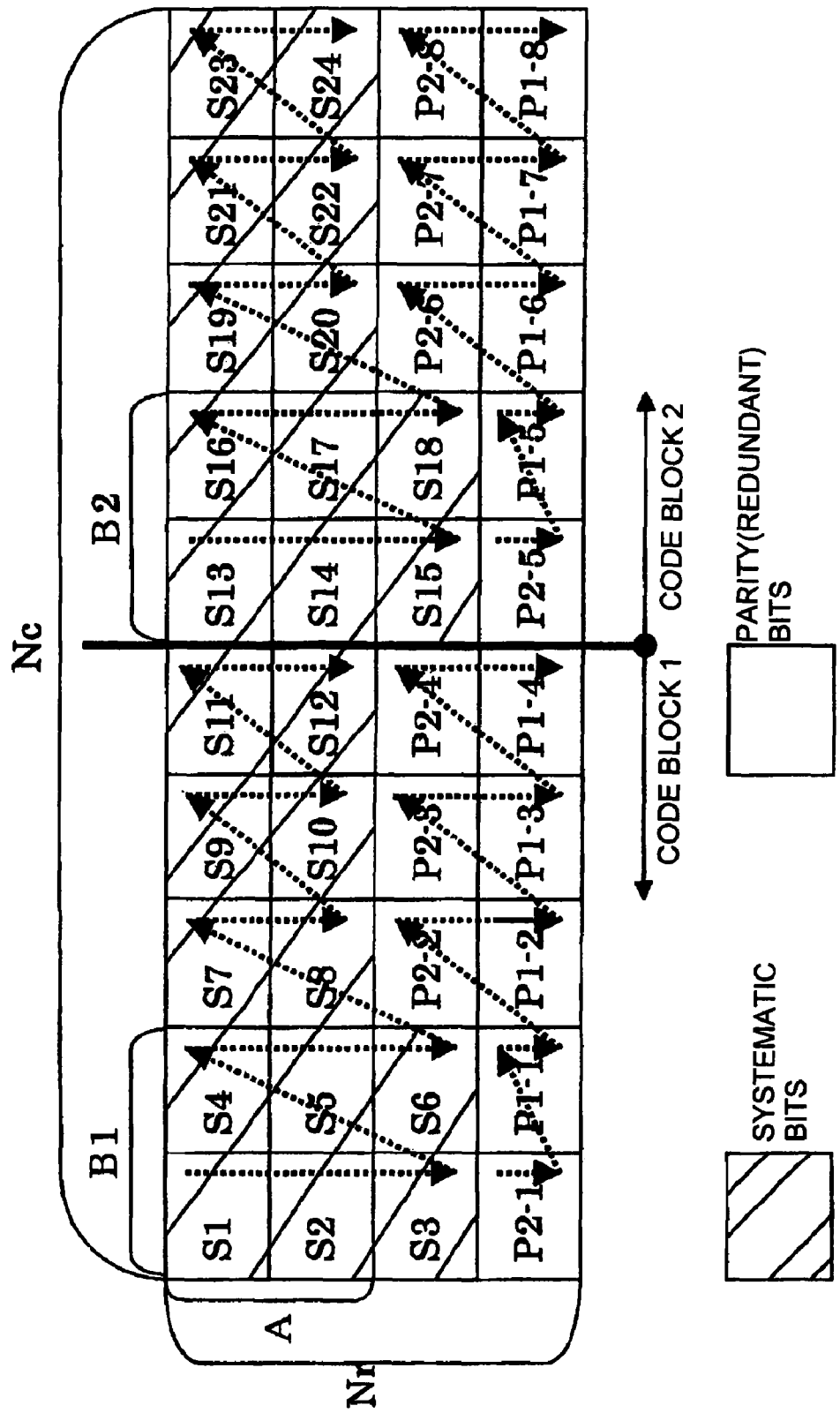
FIG. 7 is a diagram for describing the bit arrangement method of the present invention.
Figure 8:
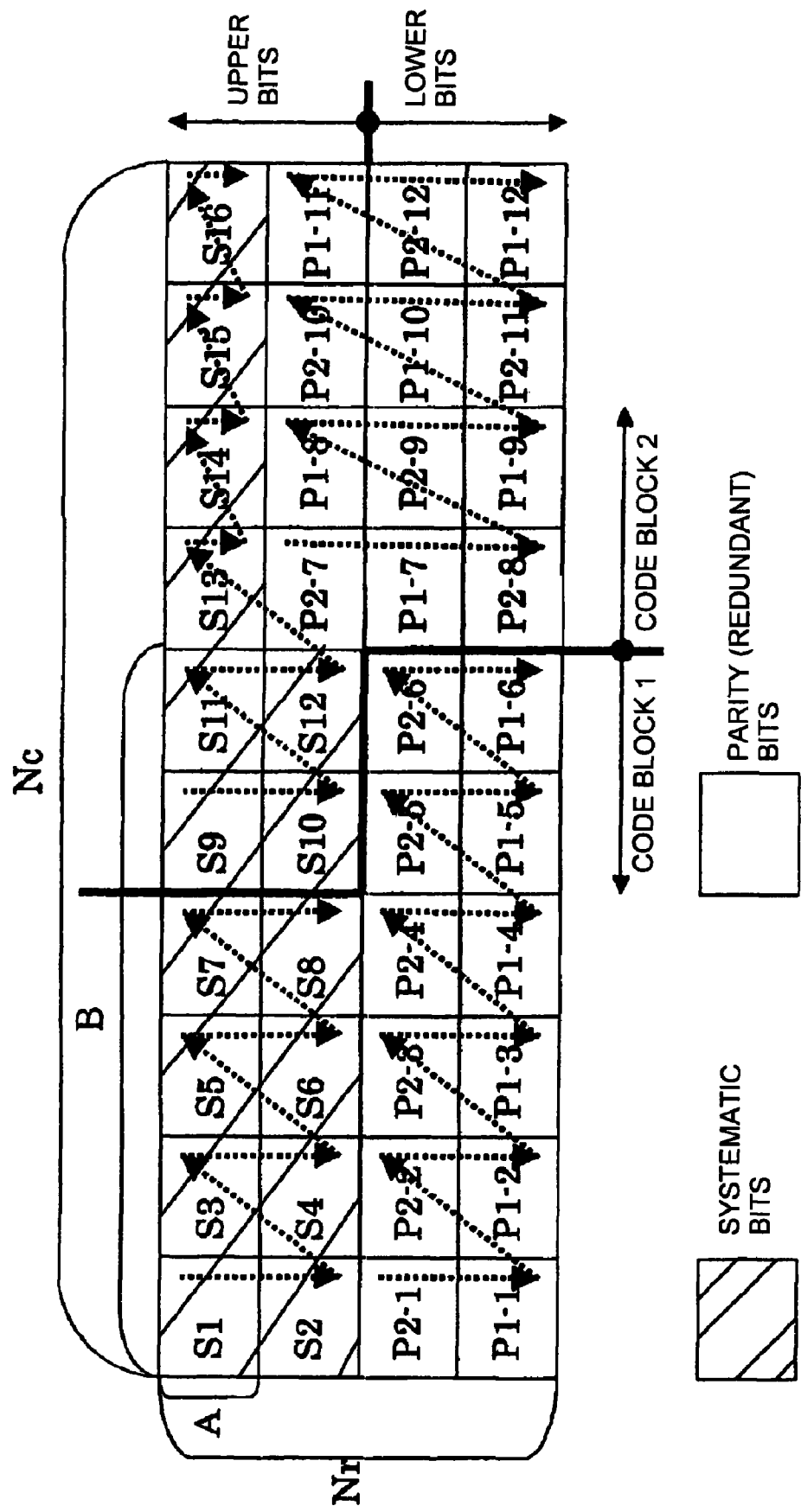
FIG. 8 is a diagram illustrating the arrangement method in the bit collecting unit 6 of the prior art.

FIG. 7 is illustrates the bit arrangement method in the bit collecting unit.

The systematic bits and redundant bits output through the rate matching process by the first rate matching unit 16 and second rate matching unit 18 must be assigned to each signal point in the 16 QAM modulation. Accordingly, these bits are aligned in bit sequences of four bits. When the other amplitude/phase modulation is to be executed, four bits may be sometimes changed to a different number of bits.

Each block segmented in the code block segmentation unit 13 is stored within the same sub-frame and therefore this block must be coupled as only one aggregation. An example of such aggregation is the bit matrix expressed as $N_r(4) \times N_c$ (10). The total number of bits is equal to the value corresponding to the transmission parameter notified with the control unit 10. The regions indicated with S1, S2, S3, P2-1 of the first column (one bit sequence) are data corresponding to only one signal point for execution of the 16 QAM modulation. According to the figure, 10 columns are provided and therefore the data for 10 signal points are illustrated.

Next, the bit arrangement method of $N_r \times N_c$ bits will then be described.

First, a quotient A and a remainder B are obtained by dividing the total sum $N_{sys}$ ($=N_{sys1}+N_{sys2}$) of the number of systematic bits $N_{sys1}$ of the first block and the number of systematic bits $N_{sys2}$ of the second block with the total number of columns $N_c$ ($N_c=N_{sys} \div 4$, for 16 QAM modulation).

The regions as many as the number of lines equal to the obtained quotient A are sequentially defined as the regions for systematic bits.

Next, the remainder B is divided with the number of segmentation blocks 2 and a quotient B1 is obtained in order to equally assign the remainder B to the first block and second block.

Accordingly, for the first block, the B1 regions are sequentially defined in the row direction from the first row from the first column of the (A+1)-th row.

For the second block, the B2 (B−B1) regions are sequentially defined as the regions for systematic bits in the row direction from the sixth column (the column in which the column number of the regions of the second block becomes a minimum) of the (A+1)-th row as illustrated in FIG. 7.

According to this definition, the regions indicated by the oblique lines in FIG. 7 are designated as the regions for the systematic bits and the remaining regions are designated as the regions for the redundant bits.

Next, when the systematic bits of the first block are assigned sequentially from the top in the column direction from the first row, first column to the regions defined for the systematic bits and the regions for the systematic bits of the first column are filled, the systematic bit regions of the second column are next filled sequentially. Accordingly, control is executed to preferentially arrange the systematic bits to the upper bit positions.

Meanwhile, regarding the redundant bits, the regions (redundant bit regions) other than the systematic bit regions illustrated in FIG. 7 are assigned from the first column. In particular, when the redundant bits corresponding to the data U' are designated as the first redundant bits, and the redundant bits corresponding to the data U" are designated as the second redundant bits, then the first bit of the second redundant bits of the first block is assigned to the first column of the redundant bit regions, the first bit of the first redundant bits of the first block is assigned next to the second column of the redundant bit regions, and the second bit of the second redundant bits of the first block is assigned next to the third column. As described above, the redundant bit regions are assigned by alternately assigning the second redundant bits and the first redundant bits. In FIG. 7, the arrow mark indicates the arrangement sequence and PM-N indicates the arrangement of the N-th bit of the M-th redundant bits. As the arrangement, for example, the input data of the first block and the input data of the second block are stored and can also be arranged to the desired position according to the read address control or the like.

The bit (sequences) arranged as described above indicate the signal points on the phase plane and when (S1, S2, S3, P2−1)=(1, 0, 1, 1) is attained, for example, this relationship indicates the signal point A as described above.

Figure 1:
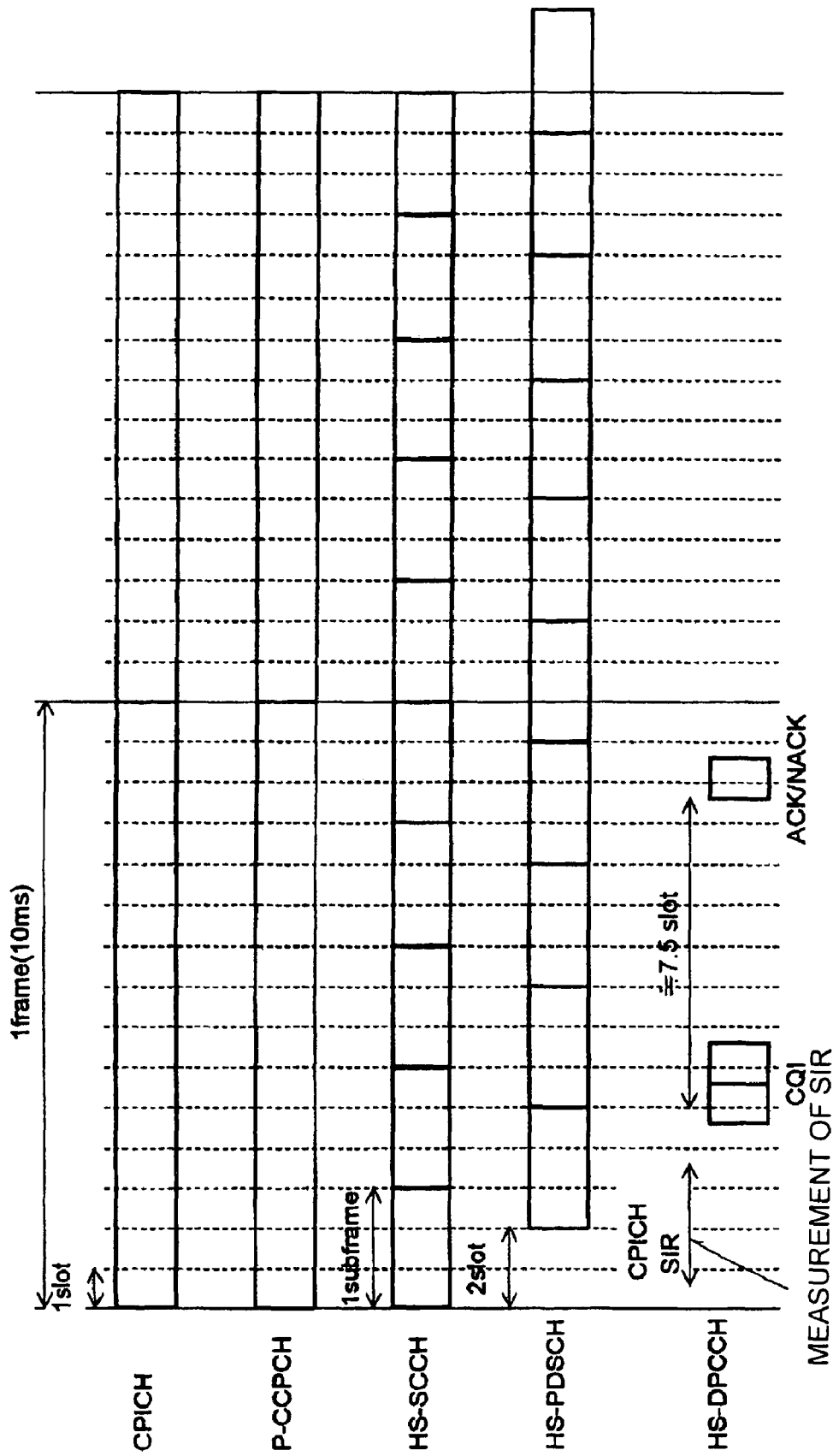
FIG. 1 diagrammatically shows a channel format in the HSDPA.
Figure 2:
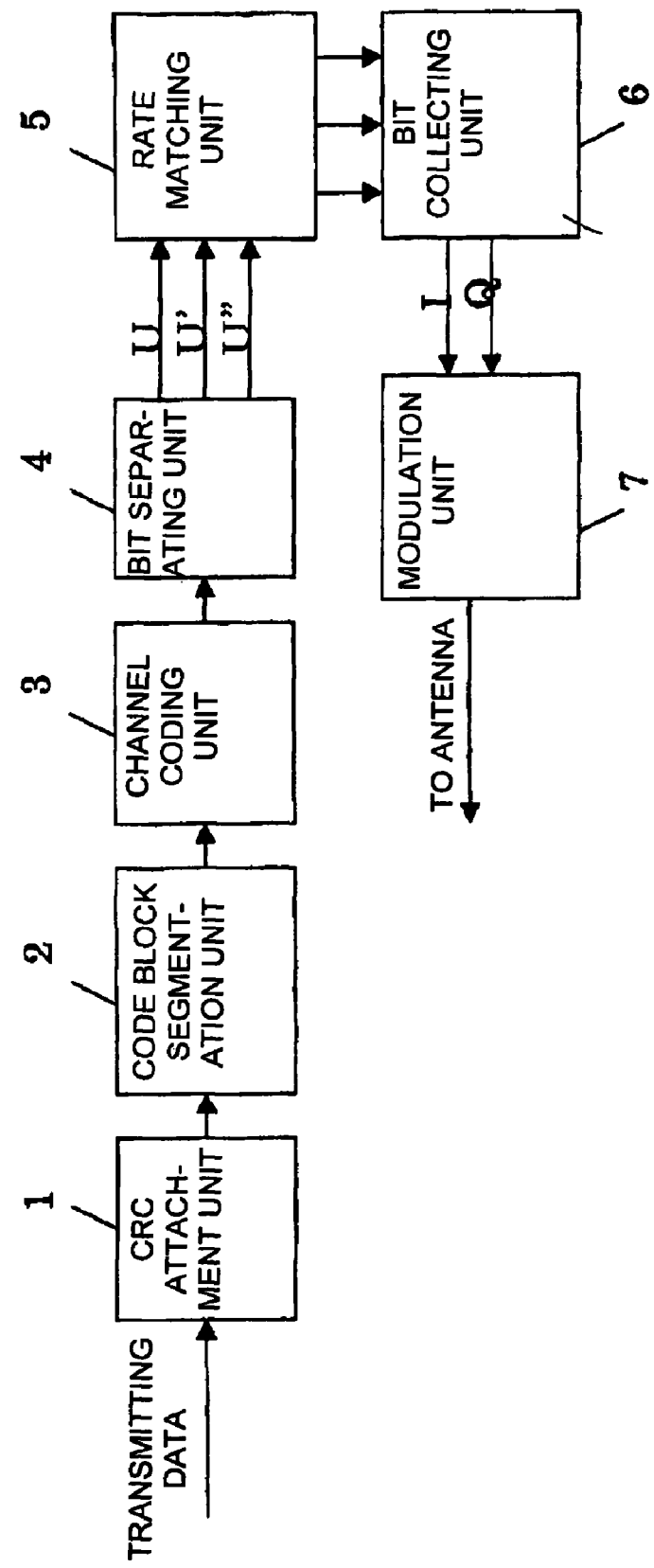
FIG. 2 diagrammatically shows a structure of a base station supporting the HSDPA.
Figure 3:
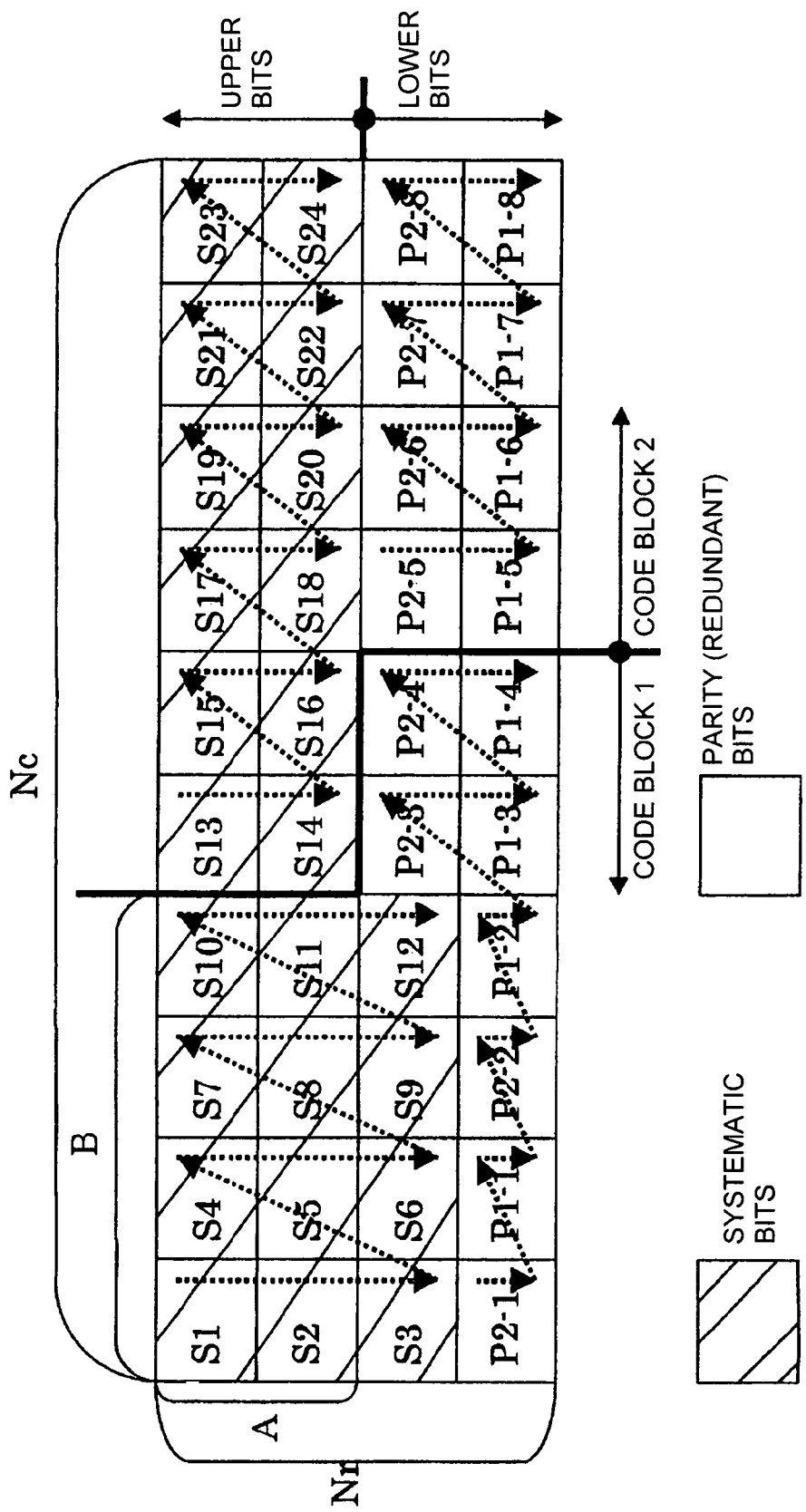
FIG. 3 is a diagram illustrating the arrangement method of the prior art in the bit collecting unit 6.
Figure 4:
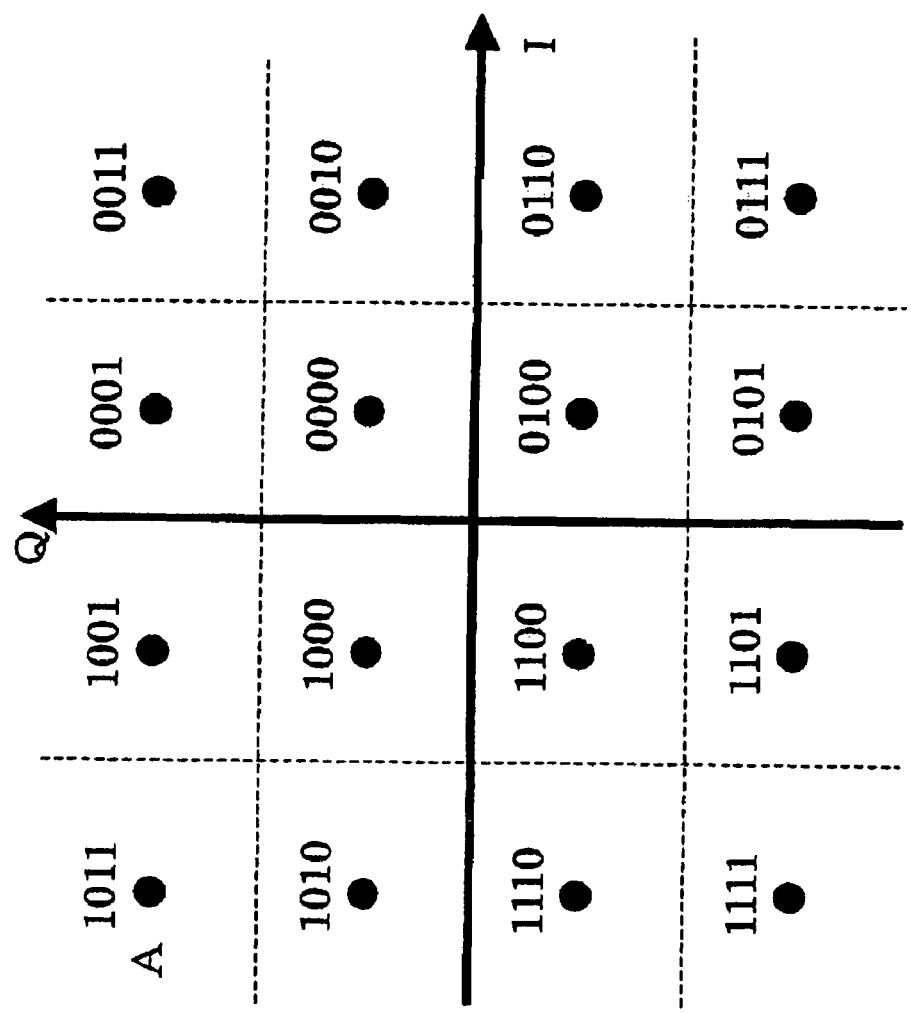
FIG. 4 is a diagram illustrating an example of each signal point on the plane in the 16-level QAM modulation.

When assignment of the signal points of the bit sequences as illustrated in FIG. 4 is executed, an error tends to be generated more easily in the lower bits, compared to the upper bits of the bit sequences of four bits because of determination of signal points on the receiving side due to variations in phase and amplitude during radio transmission. However, referring to FIG. 7, the number of systematic bits as the important bits assigned to the lower bits (here, the 3rd and 4th bits) which will easily generate an error is considered as two (2) for both first block and second block and is then equalized among the blocks. It can also be considered here that the number of systematic bits of the first and second blocks is different in several bits and is not strictly equal. However, it is also possible to equalize such number of systematic bits as a whole under the supposition that there is no such difference in the number of bits. In some cases, weighting may also be executed to assign the upper bits to the side where many systematic bits are provided, considering such bit difference.

In other words, control is executed so that an occupation rate of the predetermined bits (systematic bits, for example) included in the first data block may be set to become closer to the occupation rate of the predetermined bit (for example, systematic bits) included in the second data block in regard to the predetermined bit position within the bit column (for example, lower bits position to easily generate an error such as the 3rd bit, 4th bit).

Figure 9:
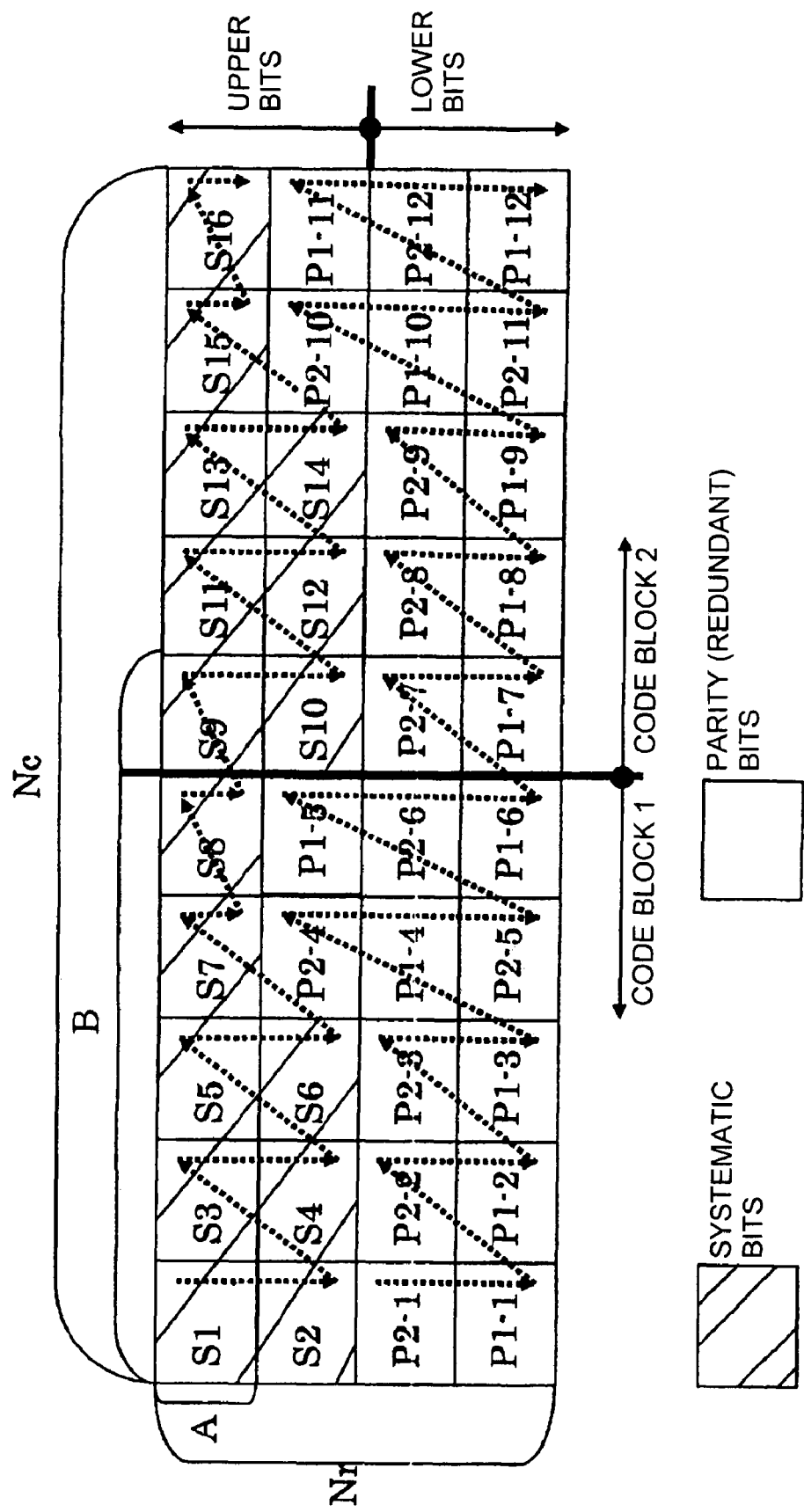
FIG. 9 is a diagram for describing the bit arrangement method of the present invention.

The example in which many systematic bits are provided and are assigned also to the lower bits as the bit position which will easily generate an error has been described above. However, in some cases, a small number of systematic bits can also be provided. In this case, according to the method described in this embodiment, assignment is executed as illustrated in FIG. 9. Symbols or the like used in FIG. 9 have the meaning same as that of those appearing in FIG. 7.

As is obvious from FIG. 9, control is executed, according to the arrangement method in this embodiment, so that the occupation rate of the predetermined bits (for example, redundant bits) included in the first data block is set closer to the rate of the predetermined bits (for example, redundant bits) included in the second data block in regard to the predetermined bit position within the bit column (for example, upper bit positions to not easily generate an error such as the 1st and 2nd bits).

Accordingly, since tolerances (for example, tolerance of the bits of the same kind) for the bits of at least the first and second blocks are equalized, deviation in that one has a higher tolerance, while the other has a lower tolerance may be reduced and the total probability of generation of an error can be lowered.

Moreover, tolerances for the phase/amplitude variations are closed during radio transmission among the blocks for the systematic bits as the important information and it is now possible to alleviate the situation that the bits having the lower tolerance will generate an error exceeding the error correction capability thereof, although the bits having the higher tolerance may allow generation of further error with the error correcting process of the turbo code or the like.

Moreover, in this embodiment, only one CRC check bit result of the CRC arithmetic operation, which is the code for detecting the error, is attached in common to the first block and second block in order to reduce the redundant bits. On the receiving side, the data of the first and second blocks is received and the CRC arithmetic operation is executed to check whether the received CRC check bits are equal to the result of the CRC arithmetic operation. Accordingly, if an error is detected, re-transmission is executed by transmission of the re-transmission request.

In this case, if any consideration is not taken into account, as in the case of the prior art, for difference in tolerance for an error in the first and second blocks, the possibility of generation of error becomes high only in the block having the lower tolerance and thereby re-transmission frequency increased. When the error detection code is attached to each block, an error can be detected for each block. Therefore, the re-transmission need only be executed for the block including an error. However, when the error detection code is attached in common to a plurality of blocks, the block including an error cannot be identified and the plurality of blocks as a whole including the correct code blocks must be re-transmitted.

However, in this embodiment, since tolerances for error in the first block and second block are set closely with each other, existence or non-existence of error in the first and second blocks is different only in rare cases and this situation may be matched with attachment of a common error detection code for a plurality of blocks.

In other words, the possibility for error only in any of the first and second blocks is lowered and the possibility for the result in which an error is simultaneously generated in both blocks or an error is not generated in either block becomes high. Accordingly, waste of radio resources such as re-transmission of the correct code may be lowered during the re-transmission process.

CONCLUSION

As the conclusion of the first embodiment, the method of calculating each value used for general alignment of bits when the number of segmentations of blocks is selected to be M will be described. <N> means the maximum integer equal to or less than N.

$$A = <N_{sys} \div N_c>$$

$$B1 = <(N_{sys} - A \times N_c) \div M>$$

$$B2 = <(N_{sys} - A \times N_c - B1) \div (M-1)>$$

...

$$BL = <\{(N_{sys} - A \times N_c - (B1+B2+\ldots+B(L-1))) \div (M-(L-1))\}>$$

...

$$BM = N_{sys} = A \times N_c - (B1+B2+\ldots+B(M-1))$$

Here, the following may also be considered under the condition that [N] is assumed to indicate the minimum integer equal to N or larger.

$$A = <N_{sys} \div N_c>$$

$$B1 = [(N_{sys} - A \times N_c) \div M]$$

$$B2 = [(N_{sys} - A \times N_c - B1) \div (M-1)]$$

...

$$BL = [\{(N_{sys} - A \times N_c - (B1+B2+\ldots+B(L-1))) \div M - (L-1)\}]$$

...

$$BM = Nsys - A \times Nc - (B1+B2+\ldots+B(M-1))$$

As described above, the present embodiment discloses a bit arrangement method for the bit sequence generating apparatus, which segments the transmitting data into the two or more bit groups, including a first bit group also including the X bits, and a second group also including the Y bits, and generates the L bit sequences by arranging the bits of the first bit group, and the bits of the second bit group, to each bit position in the bit sequences of predetermined length having the first bit position and the second bit position, which generates an error more easily than the first bit position, wherein when certain bits included in the first bit group and certain bits included in the second bit group are preferably arranged at the first bit position and <N> is defined as the maximum integer equal to or less than N, the number of the certain bits included in the first bit group arranged at the second bit position is set smaller than $$X + Y - <(X+Y) \div L> \times L \quad (3)$$

and the number of the certain bits included in the second bit group arranged to the second bit position is set equal to or larger than 1 under the conditions of $$(<(X+Y) \div L> + 1) \times (X+Y - <(X+Y) \div L> \times L) < X \quad (1), \text{ and}$$

$$2 \leq (X+Y - <(X+Y) \div L> \times L) \quad (2).$$

According to the arrangement method of the prior art, when the conditions (1) and (2) are satisfied, the number of the certain bits included in the first bit group arranged at the second bit position is matched with the value of (3) and the number of the certain bits included in the second bit group arranged at the second bit position becomes 0, resulting in a large difference in the error tolerance between both bit groups (among systematic bits). However, according to the first embodiment, which is an example of the method in which the number of the certain bits included in the first bit group arranged at the second bit position is set, under the conditions of (1) and (2), smaller than the value of condition (3), and the number of the certain bits included in the second bit group arranged at the second bit position is set equal to 1 or larger, the difference in error tolerance among the first bit group and second bit group is reduced.

Moreover, with another expression, a bit collection unit is provided as in this embodiment to re-arrange the data having completed the rate matching process and to generate $N_c$ bit sequences, wherein each bit sequence includes 4 bits, for 16 QAM in the radio base station corresponding to the HSDPA. Accordingly, the data includes at least the first data block and second data block owing to the segmentation in the code block segmentation unit and when <N> is defined as the maximum integer equal to or less than N and A and B are respectively defined as $A = <N_{sys} \div N_c>$, $B = N_{sys} - A \times N_c$, the bit collection unit continuously arranges the systematic bits up to the $N_c$-th column from the first column for the rows from the first row to A-th row and also arranges not continuously the B systematic bits up to the $N_c$-th column from the first column for the (A+1)-th row. The bit collection unit can arrange the B systematic bits up to the $N_c$-th column from the first column for the (A+1)-th row under the condition of partially arranging the B systematic bits in a continuous manner.

Therefore, the systematic bits must be continuously arranged up to the B-th column from the first column for the (A+1)-th row like the prior art but the systematic bits can also be arranged not continuously up to the $N_c$-th column from the first column. As a result, tolerance among the blocks can be adjusted.

Description of the Second Embodiment

Next, another method of the bit arrangement method in the bit collecting unit will be described in detail.

This method is characterized in the arrangement method of the bits B of the remainder of the systematic bits described above.

In particular, while the bits B of the remainder are arranged at the (A+1)-th row, the column in which the systematic bits are arranged is defined as $1 + <N_c \times (k-1) \div (N_{sys} - A \times N_c)>$. Here, $k = 1, 2, \ldots, N_{sys} - A \times N_c$. For example, when the setting is executed as $N_{sys} = 24$, the number of redundant bits = 16, $N_r = 4$, and $N_c = 10$, the following results are obtained:

$$Nr = <24 \div 10> = 2.$$

Column 1 in which the systematic bits are arranged = $1 + <10 \times (1-1) \div (24 - 2 \times 10)> = 1$ Column 2 in which the systematic bits are arranged = $1 + <10 \times (2-1) \div (24 - 2 \times 10)> = 3$ Column 3 in which the systematic bits are arranged = $1 + <10 \times (3-1) \div (24 - 2 \times 10)> = 6$ Column 4 in which the systematic bits are arranged = $1 + <10 \times (4-1) \div (24 - 2 \times 10)> = 8$.

Figure 10:
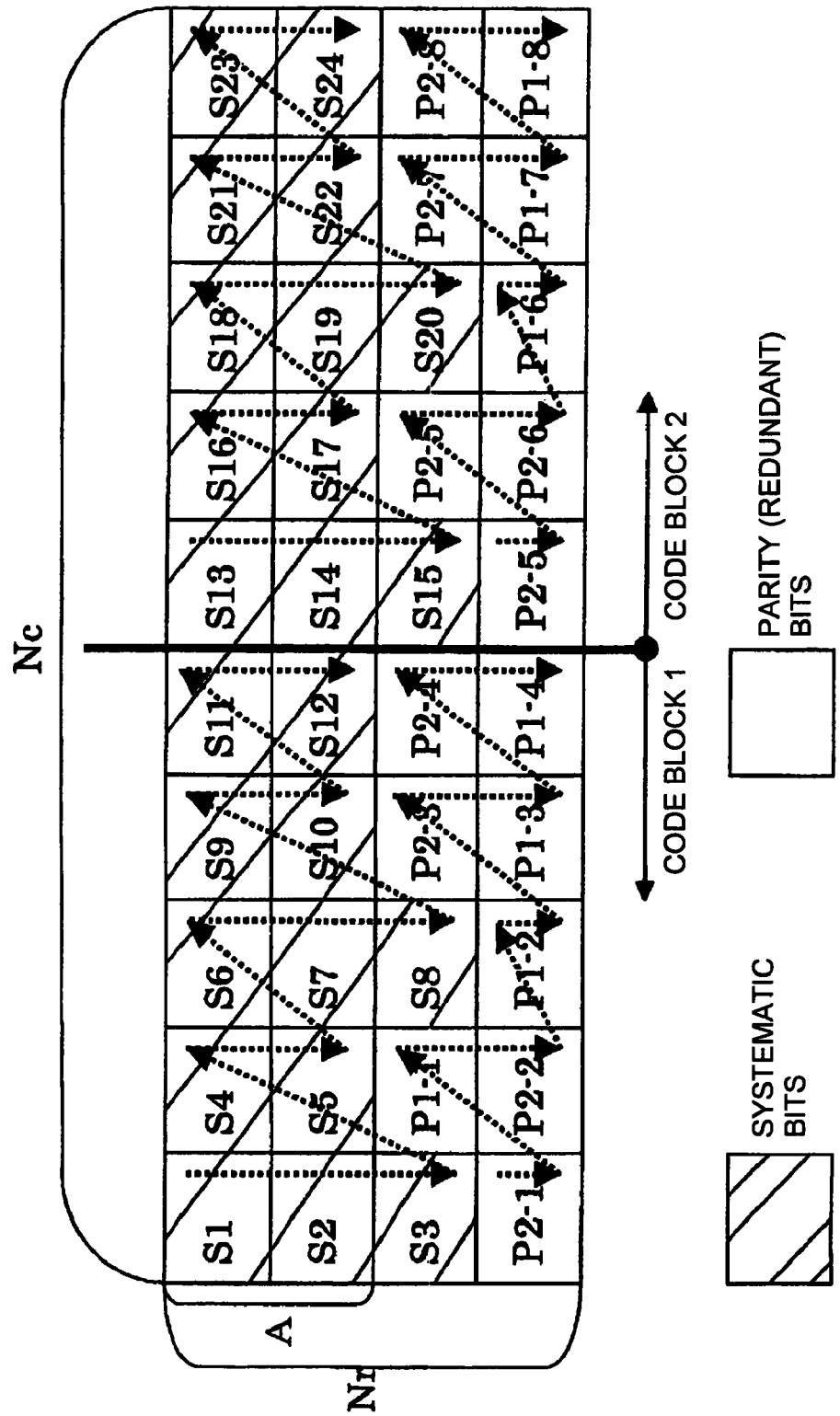
FIG. 10 is a diagram for describing the arrangement of bit sequence corresponding to the second embodiment.

Therefore, the regions indicated with the oblique lines in FIG. 10 are defined as the regions where the systematic bits are arranged, while the other regions are regions where the redundant bits are arranged. The arrangement sequence in each region is identical to that in the first embodiment and this description will not be repeated here.

In this embodiment, since the systematic bits B of the remainder can be separately arranged (for example, arranged without concentration in the adjacent columns) in the predetermined bit position (at the lower bit positions having a tolerance for an error which is lower than that of the upper bits when the natural arrangement is executed, for example, in the 16 QAM modulation), the tolerance for error can easily be equalized among the blocks by sequentially arranging the bits of the first and second blocks from the left side without considering the number of blocks.

When the corresponding relationship between the bit sequences and signal points is determined in the manner that the upper bits are defined to have a tolerance for error that becomes lower than that of the lower bits, the important bits (for example, the systematic bits) are preferably arranged to provide the lower bits having higher tolerance and the number of important bits (for example, systematic bits) to be assigned to the bits having lower tolerance among the blocks can preferably be equalized.

In the first and second embodiments, the 16 QAM has been discussed as an example of the multi-level modulation system, but the other multi-level modulation system, such as 8-phase PSK, can also be utilized.

Figure 11:
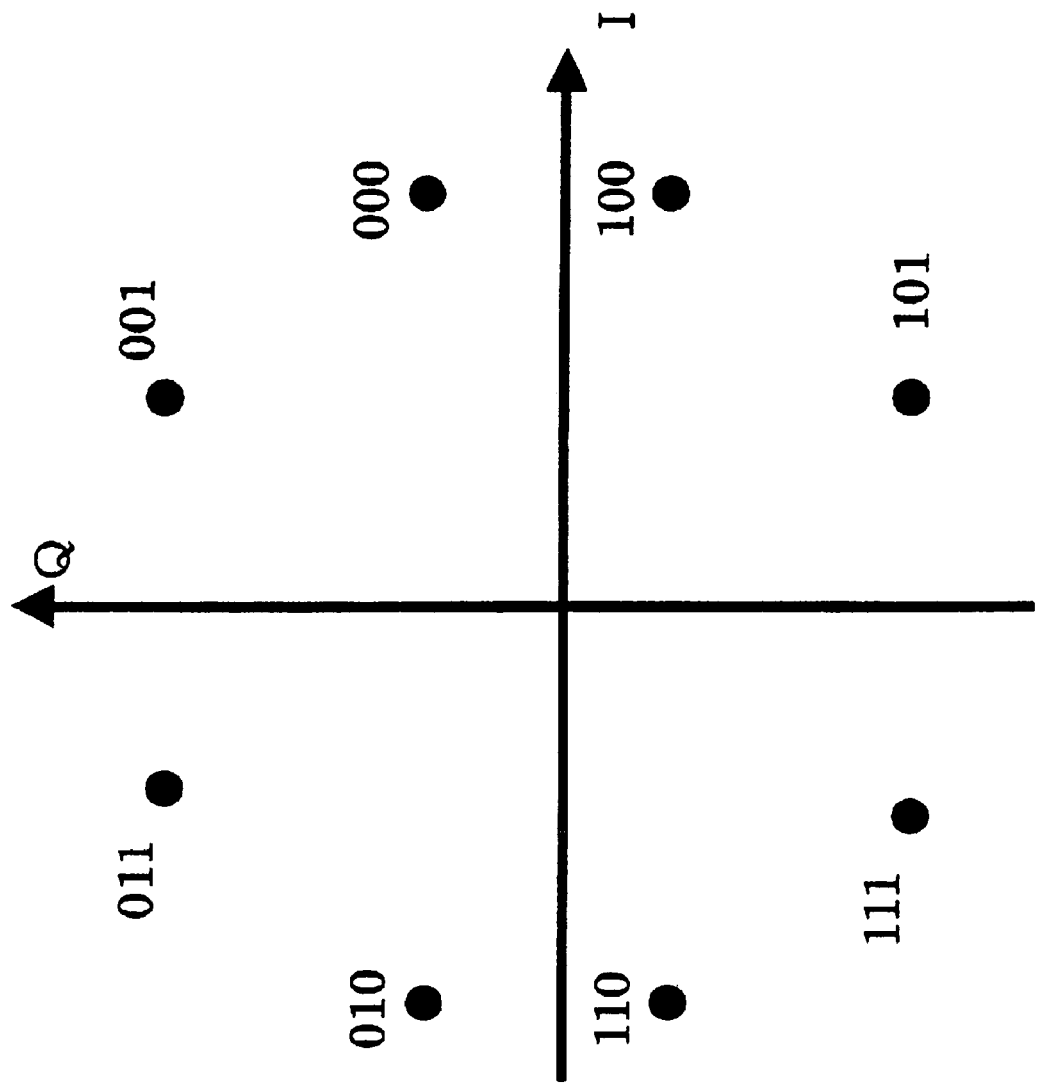
FIG. 11 is a diagram for describing introduction of the 8 PSK system.

For example, when a bit sequence of three bits is assigned to each signal point as illustrated in FIG. 11, a difference is generated in the tolerances for an error at the bit positions in the bit sequence. Therefore it is also very effective, as in the case where the present invention is adapted. In the example of FIG. 11, the signal points where the codes of two adjacent signal points become identical to their own codes, signal points exist for the first bit and the second bit of the bit sequence of three bits. However, for the third bit, such a signal point does not exist and at least any of two adjacent signal points has a code that is different from its own signal point for all signal points. Accordingly, the code-to-code distance for the third bit is generally short compared to the first and second bits. As a result, the third bit is considered to be the bit position in which an error is generated more easily compared to the first and second bits.

Moreover, when 64 QAM is employed, the tolerance for generation of error is sometimes graded in the three levels (first bit position, second bit position, and third bit position) in accordance with the bit position resulting from the correspondence between the bit sequence and the signal point.

It is of course preferable that the bit sequence generating means for controlling generation of the bit sequences set, for the predetermined bit position within the bit sequence, the occupation rate, for occupation of the predetermined bits included in the first data block, closer to the occupation rate, for occupation of the predetermined bits included in the second data block, determined, as the predetermined bit position, any of the first bit position, second bit position, and third bit position.

Since tolerances of the bits of at least the first block and the second block (for example, tolerances of the same kind of bits) are equalized, there is less deviation in the tolerances, that is, one has a higher tolerance, while the other has a lower tolerance, and therefore the total probability of generation of error can be lowered.

Moreover, the chance of an unwanted signal being transmitted by re-transmitting the blocks in the side where there is no error can be reduced through enhancement of the probability of the case where an error is generated simultaneously in both blocks or no error is generated in either block.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A method of transmitting data comprising:
controlling generation of bit sequences by a controller to adjust an occupation rate occupied with predetermined bits included in a first data block, which is obtained by encoding first data, to be closer to an occupation rate occupied with predetermined bits included in a second data block, which is obtained by encoding second data, in regard to first bit positions of the predetermined bits, the first bit positions being distinguished from second bit positions based on an error tolerance resulting from a correspondence to a signal point on a phase plane, wherein a sum of a number of the predetermined bits included in the first data block and the predetermined bits included in the second data block is less than a total number of the first bit positions; and
performing multi-level modulation for transmission by a modulator based on bit sequences generated by the controller.

2. The method according to claim 1, further comprising:
transmitting the multi-level modulated signals within a radio frame.

3. The method according to claim 1, wherein respective bit sequences are provided, resulting from the correspondence to a signal point on the phase plane, the bit sequences having first bit positions, and having second bit positions in which an error is more easily generated than that in the first bit positions, and wherein the predetermined bit positions are the first bit positions or the second bit positions.

4. The method according to claim 1, wherein: the first data block includes systematic bits and redundant bits and the second data block includes systematic bits and redundant bits, the predetermined bits included in the first data block and the predetermined bits included in the second data block are systematic bits, and the controlling generation of bit sequences comprises: executing control to preferentially allocate the systematic bits to the first bit positions in accordance with the control.

5. The method according to claim 4, wherein the multilevel modulation is 16 QAM modulation and the first bit positions are upper bits and the second bit positions are lower bits.

6. The method according to claim 5, wherein the upper bits are a first bit and a second bit and the lower bits are a third bit and a fourth bit.

7. The method according to claim 1, wherein: the first data block includes systematic bits and redundant bits and the second data block includes systematic bits and redundant bits, and the predetermined bits included in the first data block and the predetermined bits included in the second data block are systematic bits or redundant bits.

8. The method according to claim 1, wherein: the first data block and the second data block include systematic bits obtained by turbo encoding, first data block and the second data block include first redundant bits and second redundant bits, and both predetermined bits included in the first data block and predetermined bits included in the second data block are systematic bits, or redundant bits, or first redundant bits, or second redundant bits.

9. A method of transmitting data comprising:
controlling generation of bit sequences to adjust an occupation rate occupied with predetermined bits included in a first data block, which is obtained by encoding first data to be closer to an occupation rate occupied with predetermined bits included in a second data block, which is obtained by encoding second data, in regard to first bit positions of the bit sequences generated using bits included in the first and second data blocks, the first bit positions being distinguished from second bit positions based on an error tolerance resulting from a correspondence to a signal point on a phase plane; and performing multi-level modulation for transmission based on the generated bit sequences.

10. A method of transmitting data comprising:

controlling generation of bit sequences to adjust an occupation rate occupied with predetermined bits included in a first data block, which is obtained by encoding first data, to be closer to an occupation rate occupied with predetermined bits included in a second data block, which is obtained by encoding second data, in regard to first bit positions of the predetermined bits, the first bit positions being distinguished from second bit positions based on an error tolerance resulting from a correspondence to a signal point on a phase plane; and performing multi-level modulation for transmission based on the generated bit sequences.

* * * * *